United States Patent
Lim et al.

(10) Patent No.: US 7,679,329 B2
(45) Date of Patent: Mar. 16, 2010

(54) METHOD FOR COMPENSATING STATE OF CHARGE OF BATTERY, BATTERY MANAGEMENT SYSTEM USING THE METHOD, AND HYBRID VEHICLE HAVING THE BATTERY MANAGEMENT SYSTEM

(75) Inventors: Gye-Jong Lim, Yongin-si (KR); Han-Seok Yun, Yongin-si (KR); Se-Wook Seo, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 300 days.

(21) Appl. No.: 11/639,306

(22) Filed: Dec. 15, 2006

(65) Prior Publication Data
US 2007/0145948 A1 Jun. 28, 2007

(30) Foreign Application Priority Data
Dec. 22, 2005 (KR) .................... 10-2005-0127718

(51) Int. Cl.
*H01M 10/46* (2006.01)
(52) U.S. Cl. .................................... 320/132
(58) Field of Classification Search ............. 320/107, 320/132, 149; 324/426, 427, 430, 433
See application file for complete search history.

(56) References Cited

U.S. PATENT DOCUMENTS

| | | | |
|---|---|---|---|
| 6,424,157 B1 * | 7/2002 | Gollomp et al. | 320/132 |
| 7,116,109 B2 * | 10/2006 | Klang | 324/426 |
| 2003/0214303 A1 * | 11/2003 | Ying | 324/426 |

FOREIGN PATENT DOCUMENTS

JP 2000-166109 6/2000

* cited by examiner

*Primary Examiner*—Edward Tso
(74) *Attorney, Agent, or Firm*—Stein McEwen, LLP

(57) ABSTRACT

In an SOC compensation method, a first SOC having at least two sections is detected, and a first OCV corresponding to the first SOC is calculated; a second OCV is calculated by using the measured pack current and voltage, and an internal resistance, and a second SOC corresponding to the second OCV is calculated; when a difference between the first and second OCVs is greater than a first reference, a first compensation value corresponding to the first SOC among at least two first compensation values corresponding to the two sections is used to compensate the first SOC; and when a difference between the first and second OCVs is less than a second reference, a second compensation value corresponding to the first SOC among at least two second compensation values corresponding to the two sections is used to compensate the first SOC value.

27 Claims, 4 Drawing Sheets

METHOD FOR COMPENSATING STATE OF CHARGE OF BATTERY, BATTERY MANAGEMENT SYSTEM USING THE METHOD, AND HYBRID VEHICLE HAVING THE BATTERY MANAGEMENT SYSTEM

CROSS-REFERENCE TO RELATED APPLICATIONS

This application claims the benefit of Korean Application No. 2005-127718, filed on Dec. 22, 2005, in the Korean Intellectual Property Office, the disclosure of which is incorporated herein by reference.

BACKGROUND OF THE INVENTION

1. Field of the Invention

Aspects of the present invention relate to a battery management system. More particularly, aspects of the present invention relate to a method for compensating a state of charge (SOC) of a battery used in a vehicle using electrical energy, and a battery management system using the method.

2. Description of the Related Art

Vehicles using internal combustion engines that use gasoline or diesel have caused serious air pollution. Accordingly, in order to reduce air pollution various efforts have recently been made to develop electric or hybrid vehicles.

An electric vehicle uses a motor powered by electrical energy that is output from a battery. Since the electric vehicle typically uses a battery pack that includes a plurality of rechargeable/dischargeable secondary cells, an electric vehicle is advantageous in that it has no emission gases and less noise.

The term hybrid vehicle commonly refers to a gasoline-electric hybrid vehicle that uses gasoline to power an internal-combustion engine and an electric battery to power an electric motor. Recently, hybrid vehicles using an internal-combustion engine and fuel cells and hybrid vehicles using a battery and fuel cells have been developed. Fuel cells directly generate electrical energy by a chemical reaction between hydrogen or hydrogen-containing fuel and oxygen, both of which are continuously provided.

Since battery performance directly affects the performance of a vehicle that uses electrical energy, it is desirable for each battery cell of a battery used in a vehicle to have an optimum performance. Also, it is desirable to provide a battery management system (BMS) to measure the voltage and current of the overall battery to efficiently manage the charging/discharging operations of each battery cell.

A problem that may arise in a battery management system is that a cumulative error may be generated when a current integration method is used to detect the state of charge (SOC) of the battery. An SOC that is inaccurate due to cumulative errors reduces the reliability of the battery management system, which causes serious problems with vehicle driving operations.

The above information disclosed in this Background section is provided for enhancement of understanding of the background of the invention. The discussion of such information is not intended to represent or suggest that such information constitutes prior art that is already known in this country to a person of ordinary skill in the art.

SUMMARY OF THE INVENTION

Aspects of the present invention provide a battery management system that precisely calculates a state of charge (SOC) of a battery, an SOC compensation method thereof, and a hybrid vehicle including such a battery management system.

In a state of charge (SOC) compensation method that compensates an SOC of a battery used in a battery management system according to an embodiment of the present invention, a first SOC having at least two sections is detected, and a first open circuit voltage (OCV) corresponding to the first SOC is calculated; a pack current and a pack voltage of the battery are measured, a second OCV is calculated by using the pack current, the pack voltage, and an internal resistance, and a second SOC corresponding to the second OCV is calculated; the first OCV and the second OCV are compared, and, when a difference between the first OCV and the second OCV is greater than a first reference value, a first compensation value corresponding to the first SOC among at least two first compensation values corresponding to the at least two sections is used to compensate the first SOC; and when a difference between the first OCV and the second OCV is less than a second reference value, a second compensation value corresponding to the first SOC among at least two second compensation values corresponding to the at least two sections is used to compensate the first SOC value.

According to another aspect of the present invention, there is provided a state of charge (SOC) compensation method that compensates an SOC of a battery, the SOC compensation method comprising detecting a first SOC and calculating a first open circuit voltage (OCV) corresponding to the first SOC, wherein a range of possible SOCs is divided into at least two sections, each section being assigned a compensation value; measuring a pack current and a pack voltage of the battery, calculating a second OCV by using the pack current, the pack voltage, and an internal resistance, and calculating a second SOC corresponding to the second OCV; and comparing the first OCV and the second OCV, and, when the first OCV differs from the second OCV by an amount greater than a predetermined value, compensating the first SOC using the compensation value assigned to the section of the range of possible SOCs corresponding to the first SOC.

A battery management system according to an embodiment of the present invention is coupled to a battery including a plurality of battery cells as one battery pack. The battery management system includes an estimation state of charge (SOC) calculator, a data base, a reference SOC, and an SOC compensator. The SOC calculator calculates an estimation SOC by using a pack current of the battery. The data base stores data relating to an open circuit voltage (OCV) corresponding to the estimation SOC. The reference SOC measures the pack current and a pack voltage of the battery and uses an internal resistance to calculate a reference OCV, and it uses the data base to calculate a reference SOC corresponding to the reference OCV. The SOC compensator uses the data base to detect the OCV corresponding to the estimation SOC, uses a difference between the reference OCV and the detected OCV to determine whether to perform compensation, and varies a compensation value according to a section, the section being that to which the estimation SOC is included, to perform the compensation.

According to another aspect of the present invention, there is provided a battery management system coupled to a battery comprising a plurality of battery cells as one battery pack, the battery management system comprising: an estimation state of charge (SOC) calculator that calculates an estimation SOC by using a pack current of the battery; a data base that stores data relating to open circuit voltages (OCV) over a range of SOCs, wherein the range of SOCs is divided into at least two sections; a reference SOC calculator that uses values of the pack current, a pack voltage and an internal resistance of the battery to calculate a reference OCV, and that uses the data base to calculate a reference SOC corresponding to the reference OCV; and an SOC compensator that uses the data base to detect the OCV corresponding to the estimation SOC, that compares a difference between the reference OCV and the detected OCV with a predetermined reference value to determine whether to perform compensation, and that compensates the estimation SOC according to a compensation value according to the section in which the estimation SOC is included if the reference OCV and the detected OCV differ by a value greater than the predetermined reference value.

In addition, the first and second reference values are respectively determined according to an acceptable error range of the estimation SOC. Further, the first and second reference values may have the same absolute value having opposite signs.

The section to which the estimation SOC is included is determined to be one of at least two sections according to a change of the estimation SOC corresponding to a change of the OCV, in the data relating to the OCV corresponding to the estimation SOC. The plurality of first and second compensation values respectively-correspond to one of the at least two sections, and are determined according to a change of the estimation SOC corresponding to the change of the OCV. In addition the first and second compensation values corresponding to the same section among the at least two sections have the same value.

The estimation SOC calculator integrates the charged or discharged pack current to calculate the estimation SOC. The reference SOC calculator adds the pack voltage to a value obtained by multiplying the pack current and the internal resistance to calculate the reference SOC.

A hybrid vehicle according to an embodiment of the present invention includes a battery management system that transmits a state of charge (SOC) of a battery to an engine control unit (ECU) controlling an engine of the vehicle. The hybrid vehicle includes a sensing unit, a main control unit (MCU), and a communication unit. The sensing unit measures a pack current, a pack voltage, and an internal resistance of the battery. The main control unit uses the pack current, the pack voltage, and the internal resistance transmitted from the sensing unit to determine the SOC, and controls the battery to be charged and discharged. The communication unit transmits the SOC output from the MCU to the ECU. The MCU includes an estimation SOC calculator, a reference SOC calculator, and an SOC compensator. The estimation SOC calculator uses the pack current of the battery to calculate an estimation SOC. The reference SOC calculator uses values of the pack current, the pack voltage and the internal resistance received from the sensor to calculate a reference open circuit voltage (OCV), and calculates a reference SOC corresponding to the reference OCV. The SOC compensator detects an OCV corresponding to the estimation SOC, uses a difference between the reference OCV and the detected OCV to determine whether to perform compensation, varies a compensation value according to a section, the section being that to which the estimation SOC is included, to compensate the estimation SOC when it is required to perform the compensation, and outputs the estimation SOC when it is not required to perform the compensation.

When a difference between the reference OCV and the detected OCV is greater than a first reference value, the SOC compensator detects a first section in which the estimation SOC is included among the at least two sections of the estimation SOC and subtracts a first compensation value corresponding to the first section among the at least two first compensation values from the estimation SOC. When the difference between the reference OCV and the detected OCV is less than a second reference value, the SOC compensator detects a second section in which the estimation SOC is included among the at least two sections, and adds a second compensation value corresponding to the second section among the plurality of second compensation values to the estimation SOC. In addition, the battery management system further includes a data base for storing data relating to the OCV corresponding to the estimation SOC.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
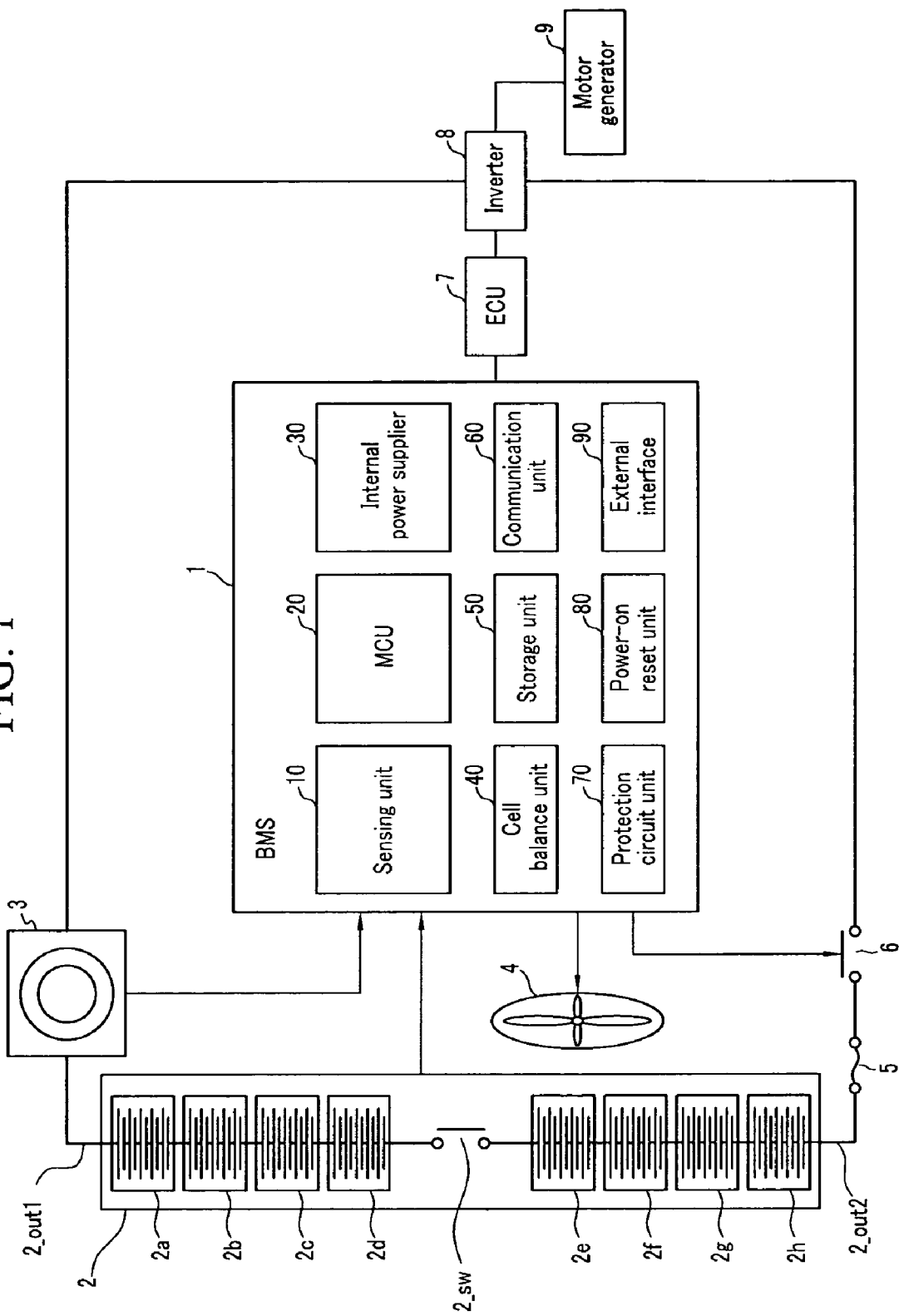
FIG. 1 is a schematic representation of a hybrid electric vehicle system using a battery management system (BMS) according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. As would be realized by persons skilled in the art, the described embodiments may be modified in various different ways, all without departing from the spirit or scope of the present invention. Accordingly, the drawings and description are to be regarded as illustrative in nature and not restrictive. Throughout this specification and the claims that follow, when it is described that an element is "coupled" to another element, the element may be directly coupled to the other element or electrically coupled to the other element through a third element. In addition, unless explicitly described to the contrary, the word "comprise" or variations such as "comprises" or "comprising" will be understood to imply the inclusion of stated elements but not the exclusion of any other elements.

FIG. 1 shows a hybrid electric vehicle system using a battery management system according to an embodiment of the present invention.

As shown in FIG. 1, the hybrid electric vehicle system according to an embodiment of the present invention includes a battery management system 1, a battery 2, a current sensor 3, a cooling fan 4, a fuse 5, a main switch 6, an engine control unit (ECU) 7, an inverter 8, and a motor generator 9.

The battery 2 includes a plurality of sub-packs 2a through 2h having a plurality of battery cells coupled in series to each other, an output terminal 2_OUT1, an output terminal 2_OUT2, and a safety switch 2_SW provided between the sub-pack 2d and the sub-pack 2e. While eight sub-packs 2a through 2h are shown in the present embodiment, with each sub-pack comprising a plurality of battery unit cells, it is to be understood that the present invention is not limited thereto. The safety switch 2_SW may be manually turned on/off to provide safety to workers when performing repairs on the battery or when replacing the battery. In the embodiment of FIG. 1, the safety switch 2_SW is provided between the sub-pack 2d and the sub-pack 2e, but the location is not limited thereto. The output terminal 2_OUT1 and the output terminal 2_OUT2 are coupled to the inverter 8.

The current sensor 3 measures an output current value of the battery 2 and outputs the measured output current value to a sensing unit 10 of the BMS 1. As a non-limiting example, the current sensor 3 may be a hall current transformer using a hall element to measure the current value and outputting an analog current signal corresponding to the measured current value.

The cooling fan 4 dissipates heat that is generated by charging and discharging the battery 2 and operates in response to a control signal of the BMS 1. Dissipating heat from the battery 2 prevents the battery 2 from being deteriorated by a temperature increase and prevents the charging and discharging efficiency from deteriorating.

The fuse 5 prevents an overcurrent, which may be caused by a disconnection or a short circuit of the battery 2, from being transmitted to the battery 2. That is, when the overcurrent is generated, the fuse 5 is disconnected so as to prevent the current from overflowing.

The main switch 6 turns the battery on or off in response to the control signal of the BMS 1 or a control signal of the ECU when an unusual phenomenon, such as, for example an overflowed voltage, an overcurrent, or a high temperature, occurs.

The BMS 1 includes a sensing unit 10, a main control unit (MCU) 20, an internal power supplier 30, a cell balance unit 40, a storage unit 50, a communication unit 60, a protection circuit unit 70, a power-on reset unit 80, and an external interface 90.

The sensing unit 10 measures an overall battery pack current, an overall battery pack voltage, the voltage of each battery cell, the temperature of each battery cell, and the peripheral temperature, converts the measured values into digital data, and transmits the digital data to the MCU 20.

The MCU 20 estimates a state of charge (SOC) and a state of health (SOH) of the battery 2 based on the overall battery pack current, the overall battery pack voltage, the voltage of each battery cell, the temperature of each battery cell, and the peripheral temperature, and generates information on the state of the battery 2. In addition, the MCU 20 uses the open circuit voltage (OCV) of the battery to perform compensation according to a section of the SOC, and calculates a more precise SOC.

The internal power supplier 30 supplies power to the BMS 1 by using a backup battery. The cell balance unit 40 balances the state of charge of each cell. That is, cells that are sufficiently charged are discharged, and cells that are relatively less charged are further charged. The storage unit 50 stores data of the current SOC and SOH when the power source of the BMS 1 is turned off. An electrically erasable programmable read-only memory (EEPROM) may be used for the storage unit 50. The communication unit 60 communicates with the ECU 7 of the vehicle. The protection circuit unit 70 uses firmware to protect the battery 2 from shocks, overcurrents, and low voltages. The power-on reset unit 80 resets the overall system when the power source of the BMS 1 is turned on. The external interface 90 couples auxiliary devices for the BMS, such as the cooling fan 4 and main switch 6, to the MCU 20. While the cooling fan 4 and the main switch 6 are shown, it is to be understood that other auxiliary devices for the BMS may be coupled through the external interface 90.

The ECU 7 determines the torque state based on information of the accelerator, the brake, and the vehicle speed, and controls the output of the motor generator 9 so that the output corresponds to the torque information. That is, the ECU 7 controls the switching operation of the inverter 8, and controls the output of the motor generator 9 so that the output corresponds to the torque information. In addition, the ECU 7 receives the SOC of the battery 2 from the MCU 20 through the communication unit 60, and controls the SOC level of the battery 2 to be at a target level (e.g., 55%). When the SOC level transmitted from the MCU 20 is lower than the target level (e.g., 55%), the ECU 7 controls the switch of the inverter 8 so as to output power toward the battery 2 and charge the battery 2. In this instance, the battery pack current I has a negative value (−). When the SOC level is greater than the target level (e.g., 55%), the ECU 7 controls the switch of the inverter 8 to output the power toward the motor generator 9 and discharge the battery 2. In this instance, the battery pack current I has a positive value (+).

The inverter 8 controls the charging and discharging of the battery 2 in response to the control signal of the ECU 7.

The motor generator 9 uses the electrical energy of the battery to drive the vehicle based on the torque information transmitted from the ECU 7.

Accordingly, since the ECU 7 charges and discharges the battery 2 based on the SOC level to prevent the battery 2 from being overcharged or over-discharged, the battery 2 may be efficiently used for a long time. However, since it is difficult to measure an actual SOC level of the battery 2 when the battery 2 is mounted on a vehicle, the BMS 1 is required to precisely estimate the SOC level by using the battery pack current and battery pack voltage sensed by the sensing unit 10 and to transmit the estimated SOC to the ECU 7.

The MCU that outputs the SOC level will now be described in further detail.

Figure 2:
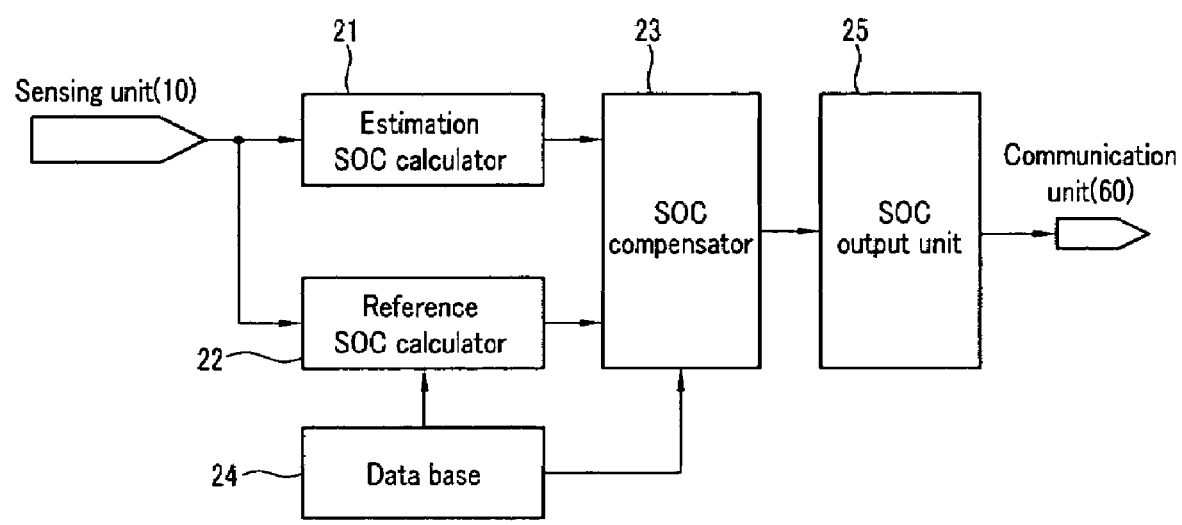
FIG. 2 is a schematic diagram of a configuration of a main control unit (MCU) of the BMS according to FIG. 1.

FIG. 2 is a schematic diagram of a configuration of the MCU 20 of the BMS 1.

As shown in FIG. 2, the MCU 20 includes an estimation SOC calculator 21, a reference SOC calculator 22, an SOC compensator 23, a data base 24, and an SOC output unit 25.

The SOC output unit 25 outputs an SOC output from the SOC compensator 23 to the communication unit 60 of the BMS 1.

The data base 24 stores a data table written by estimating an integration SOC and a corresponding open circuit voltage (OCV).

The estimation SOC calculator 21 calculates an estimation SOC based on a charging efficiency value and a pack current I transmitted from the sensing unit 10. In further detail, the estimation SOC calculator 21 uses an actual efficiency η of the battery 2 to calculate the estimation SOC, and the estimation SOC is given as Equation 1.

$$SOC = \frac{\int (i \times \eta) dt}{TAC} \times 100[\%]$$ [Equation 1]

Here, i denotes a charging and discharging current, which is a pack current Ip output from the sensing unit 10, η denotes an actual charging efficiency value of the battery 2, and TAC denotes a total amount of charge.

The reference SOC calculator 22 calculates the OCV, and calculates the integration SOC corresponding to the calculated OCV as a reference SOC. In general, the OCV is a pack voltage when the BMS 1 is in an open circuit state i.e., a pack voltage in a no-load state). For example, it is the voltage when the BMS 1 is in a key-on state. The OCV is calculated in Equation 2 based on the pack voltage, the pack current, and an internal resistance.

$$Vocv = Vp + Ip \times Ri \quad \text{[Equation 2]}$$

The SOC compensator 23 compares the OCV calculated by the reference SOC calculator 22 (Vocv) and the OCV corresponding to the estimation SOC (Vocvs), and compensates the integration SOC calculated according to the above compared result to output the compensated integration SOC to the SOC output unit 25, or outputs the integration SOC to the SOC output unit 25 when there is no need to compensate the integration SOC. Firstly, the SOC compensator 23 compares the OCV calculated by the reference SOC calculator 22 (Vocv) and the OCV corresponding to the estimation SOC (Vocvs), and calculates a voltage $\Delta V$ corresponding to a difference between Vocv and Vocvs. The voltage $\Delta V$ is given as Equation 3.

$$\Delta V = Vocv - Vocvs \quad \text{[Equation 3]}$$

Since the reference SOC is higher than a present integration SOC when the voltage $\Delta V$ is a positive value (+), the voltage $\Delta V$ is compared to a reference value a, and according to the compared result, the SOC compensator 23 uses a compensation value corresponding to the present integration SOC to increase the present integration SOC. Conversely, since the reference SOC is lower than the present integration SOC when the voltage $\Delta V$ is a negative value (−), the voltage $\Delta V$ is compared to a reference value −a, and according to the compared result, the SOC compensator 23 uses the compensation value corresponding to the current integration SOC to decrease the present integration SOC. The integration SOC varies in correspondence with the OCV. For example, in a specific embodiment, the integration SOC change according to the OCV change may be greatest when the SOC is within 40% to 60%. As described, since sections according to a ratio between the OCV change and the integration SOC change are divided, the compensation value may vary for each section. That is, it is determined which section the present integration SOC is included in, and the present integration SOC is compensated by using the compensation value corresponding to each section. The SOC compensator 23 compensates the $\Delta V$ when the $\Delta V$ does not fall within a predetermined range. Within the predetermined range, since the difference between Vocv and Vocvs is low, an error between the integration SOC and the reference SOC, caused by a difference between Vocv and Vocvs, is acceptable. That is, when the SOC error caused by the difference of $\Delta V$ is low enough that it can be ignored, the integration SOC is not compensated, and in this case, the range of the $\Delta V$ is within an error range.

A method for compensating the integration SOC by varying the compensation value according to the SOC section will now be described with reference to FIG. 3.

Figure 3:
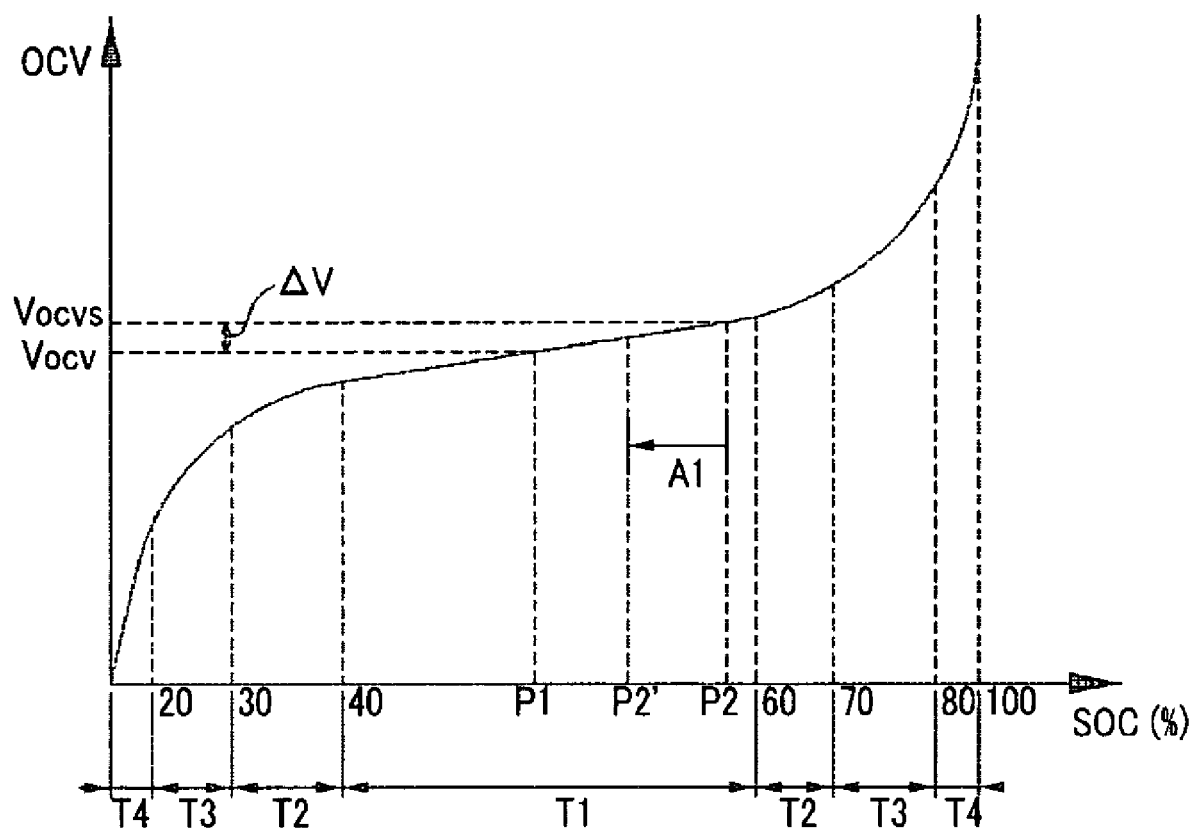
FIG. 3 is a graph of a data table of an integration state of charge (SOC) and an open circuit voltage (OCV) corresponding to each integration SOC.

FIG. 3 is a graph of a data table of the integration SOC and the OCV corresponding to each integration SOC, based on the data that is stored in the data base 24.

As shown in FIG. 3, based on a change ratio of the integration SOC change to the Vocvs, the full range of the integration SOC is divided into an SOC section T1, which includes the range from 40% to 60%, an SOC section T2, which includes the range of 30% to 40% and the range of 60% to 70%, an SOC section T3, which includes the range of 20% to 30% and the range of 70% to 80%, and an SOC section T4, which includes the range of 0% to 20% and the range of 80% to 100%, in the example given here. Compensation values A1 to A4 are assigned for the respective sections T1 to T4. (In FIG. 3, only A1 is illustrated.) The compensation values A1 to A4 have greater values in the sections having a greater change rate (that is, in sections where the SOC value has a greater change rate with respect to the OCV). This means that in the example provided, A1>A2>A3>A4.

When the difference between the OCV corresponding to the present integration SOC (Vocvs) and the OCV calculated by the reference SOC calculator 22 (Vocv) is $\Delta V$, a present integration SOC P2 falls within the section T1 and the compensation value A1 is set, as shown in FIG. 3. Accordingly, a compensation SOC P'2 reduced by the compensation value A1 from the present integration P2 is generated.

When the tolerance range of $\Delta V$ is given as "−a<$\Delta V$<a", the respective compensation values A1 to A4 may be set to be less than a least value among the difference between the corresponding integration SOC and the reference SOC, in the respective sections T1 to T4. In further detail, the differences between the current integration SOC and the reference SOC may differ in section T1, and the least value among the differences between the current integration SOC and the reference SOC is calculated as the compensation value. The compensation value A1 may be set to be lower than the calculated value. In this case, a is a reference value for determining whether $\Delta V$ is within the acceptable error range, and the reference value a may be predetermined. When the error range required to compensate the integration SOC is narrow, a lower reference value a may be set. In the example given here, the same compensation value (A1 to A4) is used to increase or decrease the integration SOC when the current integration SOC is within the same section (T1 to T4, respectively), but the compensation value is not limited to this and different compensation values may be used to increase or decrease the integration SOC when the current SOC is within the same section. In addition, while the reference value a and the reference value −a may have the same absolute value and opposite signs, they also may respectively have different absolute values.

A method for compensating the integration SOC according to the embodiment of the present invention will now be described with reference to FIG. 4.

Figure 4:
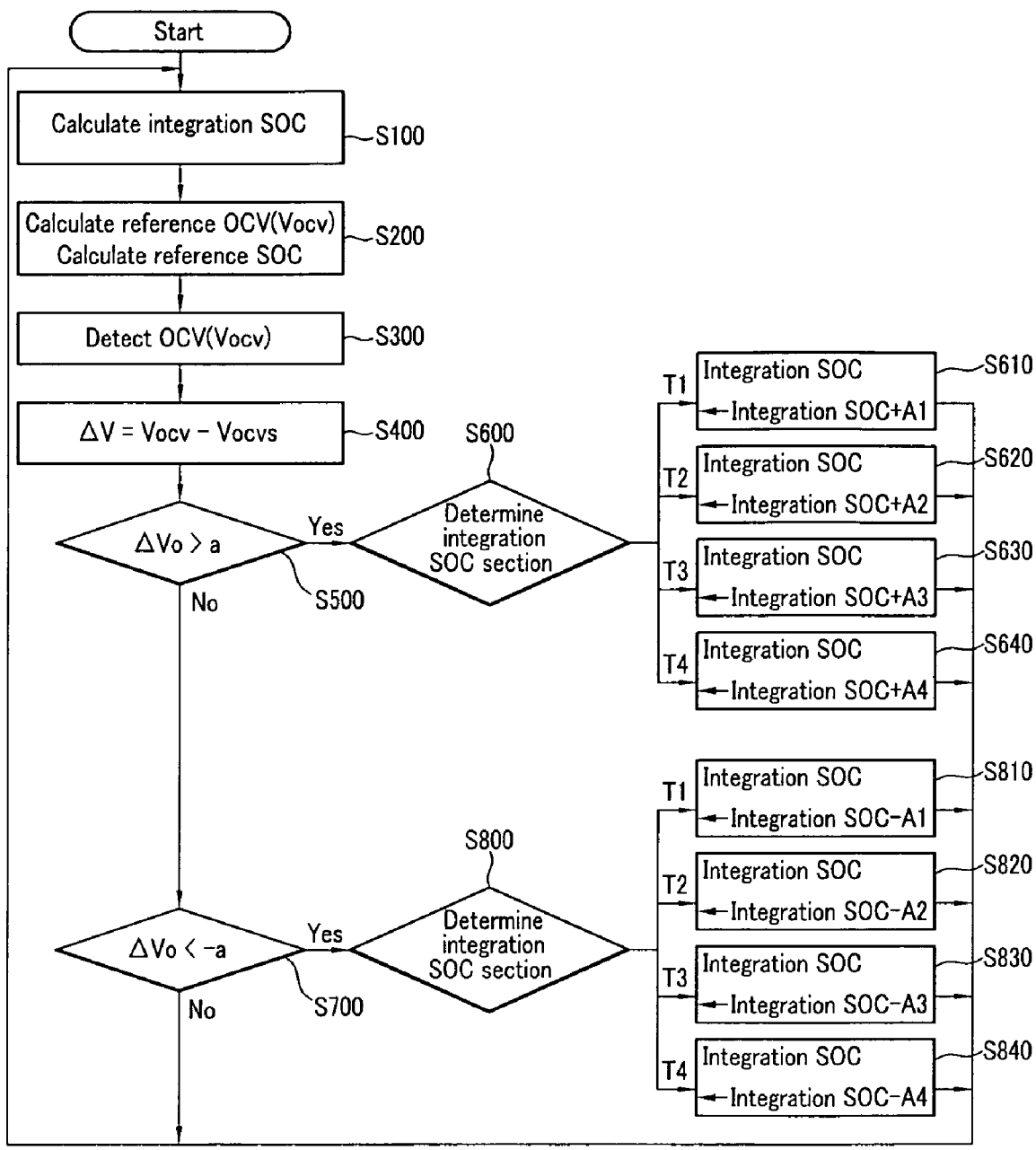
FIG. 4 is a flowchart representing a method of compensating the integration SOC according to the embodiment of the present invention.

FIG. 4 is a flowchart representing the method for compensating the integration SOC according to an embodiment of the present invention. In S100, the estimation SOC calculator 21 uses the pack current Ip input from the sensing unit 10 to calculate the integration SOC by using Equation 1. In S200, the reference SOC calculator 22 calculates the reference OCV (Vocv) by using the pack current Ip, the pack voltage Vp, the internal resistance Ri, and Equation 2, and detects the reference SOC corresponding to the Vocv from the data table of the integration SOC and the OCV corresponding to the integration SOC. In S300, the SOC compensator 23 receives the integration SOC from the estimation SOC calculator 21 and receives the reference SOC and the Vocv from the reference SOC calculator 22. The SOC compensator 23 detects the Vocvs corresponding to the input integration SOC from the data table of the data base 24. In addition, in S400, the SOC compensator 23 calculates the voltage difference $\Delta V$ between the reference OCV Vocv and the OCV Vocvs.

In S500, the SOC compensator 23 compares the voltage difference $\Delta V$ and the reference value a. When the voltage difference $\Delta V$ is greater than the reference value a, this indicates that the actual SOC is greater than the integration SOC and the difference between the actual SOC and the integration SOC exceeds the acceptable error range. In such a case, it is advantageous to compensate the integration SOC. Accordingly, in S600, it is determined which SOC section includes the present integration SOC. If the present integration SOC is included in section T1, the compensation value A1 is added to the integration SOC in S610. Likewise, if the present integration SOC is included in one of sections T2, T3, or T4, the compensation value A2, A3, or A4 corresponding to the respective section is added to the present integration SOC to compensate the present integration SOC in S620 to S640.

On the other hand, if the voltage difference ΔV is not greater than the reference value a, the SOC compensator 23 compares the voltage difference ΔV and the negative reference value −a in step S700. When the voltage difference ΔV is less than the negative reference value −a, this indicates that the integration SOC is greater than the actual SOC and the difference between the integration SOC and the actual SOC exceeds the acceptable error range. In such a case, it is advantageous to compensate the integration SOC. Accordingly, in S800, it is determined which SOC section includes the present integration SOC. When the present integration SOC is included in section T1, the compensation value A1 is subtracted from the integration SOC in S810. When it is determined that section the present integration SOC is included in one of T2, T3, or T4, the compensation value A2, A3, or A4 corresponding to the respective section is subtracted from the present integration SOC to compensate the present integration SOC in S820 to S840.

As described above, an error rate of the integration SOC is determined by comparing the OCV corresponding to the integration SOC (Vocvs) and the OCV calculated by using the pack voltage, the pack current, and the internal resistance of the present battery pack (Vocv), and since the integration SOC is compensated by varying the compensation value according to the section having the integration SOC when the error rate exceeds the acceptable range, a more precise SOC may be calculated. Accordingly, the battery management system may perform a more precise battery control operation, and it may prevent a malfunction caused by integration SOC error.

While aspects of this invention have been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

According to an embodiment of the present invention, a state of charge (SOC) compensation method for obtaining a more precise SOC of a battery by varying a compensation value according to an SOC level and a battery management system using the SOC compensation method is provided.

In addition, aspects of the present invention have been made in an effort to provide a battery management system for preventing a malfunction by using a compensated estimation SOC.

Further, aspects of the present invention have been made in an effort to provide a hybrid vehicle for obtaining a more precise SOC of a battery by varying a compensation value according to an SOC level when the SOC is compensated.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A state of charge (SOC) compensation method that compensates an SOC of a battery, the SOC compensation method comprising:
    detecting a first SOC, determining a section of a full range of SOC values in which the detected first SOC is included, wherein the full range SOC values is divided into at least two sections, and calculating a first open circuit voltage (OCV) corresponding to the first SOC;
    measuring a pack current and a pack voltage of the battery, calculating a second OCV by using the pack current, the pack voltage, and an internal resistance, and calculating a second SOC corresponding to the second OCV;
    comparing the first OCV and the second OCV, and, when a difference between the first OCV and the second OCV is greater than a first reference value, compensating the first SOC using a first compensation value determined according to the section in which the first SOC is included, and when the difference between the first OCV and the second OCV is less than a second reference value, compensating the first SOC using a second compensation value determined according to the section in which the first SOC is included; and
    controlling a charging and discharging of the battery according to the compensated SOC.

2. The SOC compensation method of claim 1, further comprising, when a difference between the first OCV and the second OCV is greater than a first reference value:
    determining whether the first SOC is included in a first section among the at least two sections; and
    determining whether the first SOC is included in a second section that is different from the first section among the at least two sections,
    wherein the first SOC is reduced by the first compensation value corresponding to the first section among the plurality of first compensation values when the first SOC is included in the first section, the first SOC is reduced by the first compensation value corresponding to the second section when the first SOC is included in the second section, and the first SOC is reduced by another compensation value when the first SOC is not included in either the first or second section.

3. The SOC compensation method of claim 1, further comprising, when the difference between the first OCV and the second OCV is less than a second reference value:
    determining whether the first SOC is included in a first section among the at least two sections; and
    determining whether the first SOC is included in a second section that is different from the first section among the at least two sections,
    wherein the first SOC is increased by the second compensation value corresponding to the first section among the plurality of second compensation values when the first SOC is included in the first section, the first SOC is increased by the second compensation value corresponding to the second section when the first SOC is included in the second section, and the first SOC is increased by another second compensation value when the first SOC is not included in either the first or second section.

4. The SOC compensation method of claim 1, wherein, in the at least two respective sections, rates of changes of the first SOC corresponding to changes of the first OCV differ from each other.

5. The SOC compensation method of claim 4, wherein the plurality of first compensation values are respectively determined in correspondence with the change of the first SOC corresponding to the change of the first OCV.

6. The SOC compensation method of claim 4, wherein the plurality of second compensation values are determined in correspondence with the change of the first SOC corresponding to the change of the first OCV.

7. The SOC compensation method of claim 4, wherein an absolute value of the first reference value is the same as an absolute value of the second reference value.

8. The SOC compensation method of claim 4, wherein the first and second compensation values respectively corresponding to the at least two sections have the same value.

9. The SOC compensation method of claim 1, further comprising outputting the first SOC to a communications unit when the difference between the first OCV and the second OCV is less than a first reference value and greater than a second reference value and outputting a compensated SOC when the difference between the first OCV and the second OCV is greater than a first reference value or less than a second reference value.

10. The SOC compensation method of claim 9, wherein the battery is used in a hybrid vehicle and wherein the first SOC or compensated SOC is outputted to an engine control unit (ECU).

11. A state of charge (SOC) compensation method that compensates an SOC of a battery, the SOC compensation method comprising:
    detecting a first SOC and calculating a first open circuit voltage (OCV) corresponding to the first SOC, wherein a range of possible SOCs is divided into at least two sections, each section being assigned a compensation value;
    measuring a pack current and a pack voltage of the battery, calculating a second OCV by using the pack current, the pack voltage, and an internal resistance, and calculating a second SOC corresponding to the second OCV; and
    comparing the first OCV and the second OCV, and, when the first OCV differs from the second OCV by an amount greater than a predetermined value, compensating the first SOC using the compensation value assigned to the section of the range of possible SOCs corresponding to the first SOC; and
    controlling a charging and discharging of the battery according to the compensated SOC.

12. The method of claim 11, wherein the compensation value is subtracted from the first SOC when the first OCV is greater than the second OCV by the predetermined value.

13. The method of claim 11, wherein the compensation value is subtracted from the first SOC when the first OCV is greater than the second OCV by the predetermined value.

14. A battery management system coupled to a battery comprising a plurality of battery cells as one battery pack, the battery management system comprising:
    an estimation state of charge (SOC) calculator that calculates an estimation SOC by using a pack current of the battery;
    a data base that stores data relating to open circuit voltages (OCV) corresponding to the estimation SOC;
    a reference SOC calculator that uses values of the pack current, a pack voltage and an internal resistance of the battery to calculate a reference OCV, and that uses the data base to calculate a reference SOC corresponding to the reference OCV; and
    an SOC compensator that uses the data base to detect the OCV corresponding to the estimation SOC, that compares a difference between the reference OCV and the detected OCV to determine whether to perform compensation, and that varies a compensation value according to a section, in which the estimation SOC is included, to perform the compensation.

15. The battery management system of claim 14, wherein:
    when the difference between the reference OCV and the detected OCV is greater than a first reference value, the SOC compensator detects the section in which the estimation SOC is included, and subtracts a first compensation value corresponding to the detected section among the plurality of first compensation values from the estimation SOC; and
    when the difference between the reference OCV and the detected SOC is less than a second reference value, the SOC compensator detects the section in which the estimation SOC is included, and adds a second compensation value corresponding to the detected section among the plurality of second compensation values to the estimation SOC.

16. The battery management system of claim 15, wherein the first and second reference values are respectively determined according to an acceptable error range of the estimation SOC.

17. The battery management system of claim 16, wherein the first and second reference values have the same absolute value having opposite signs.

18. The battery management system of claim 15, wherein the section in which the estimation SOC is included is determined to be one of at least two sections according to a change of the estimation SOC corresponding to a change of the OCV, in the data relating to the OCV corresponding to the estimation SOC.

19. The battery management system of claim 18, wherein the plurality of first and second compensation values respectively correspond to one of the at least two sections, and are determined according to a change of the estimation SOC corresponding to the change of the OCV.

20. The battery management system of claim 19, wherein the first and second compensation values corresponding to the same section among the at least two sections have the same value.

21. The battery management system of claim 13, wherein the estimation SOC calculator integrates the charged or discharged pack current to calculate the estimation SOC.

22. The battery management system of claim 21, wherein the reference SOC calculator adds the pack voltage to a value obtained by multiplying the pack current and the internal resistance to calculate the reference SOC.

23. A battery management system coupled to a battery comprising a plurality of battery cells as one battery pack, the battery management system comprising:
    an estimation state of charge (SOC) calculator that calculates an estimation SOC by using a pack current of the battery;
    a data base that stores data relating to open circuit voltages (OCV) over a range of SOCs, wherein the range of SOCs is divided into at least two sections;
    a reference SOC calculator that uses values of the pack current, a pack voltage and an internal resistance of the battery to calculate a reference OCV, and that uses the data base to calculate a reference SOC corresponding to the reference OCV; and
    an SOC compensator that uses the data base to detect the OCV corresponding to the estimation SOC, that compares a difference between the reference OCV and the detected OCV with a predetermined reference value to determine whether to perform compensation, and that compensates the estimation SOC according to a compensation value according to the section in which the estimation SOC is included if the reference OCV and the detected OCV differ by a value greater than the predetermined reference value.

24. The battery management system of claim 23, further comprising an SOC output unit that outputs a compensated SOC or, if the difference between the reference OCV and the detected OCV is less than the predetermined reference value, outputs the estimated SOC without compensation.

25. A hybrid vehicle comprising a battery management system that transmits a state of charge (SOC) of a battery to an engine control unit (ECU) controlling an engine of the vehicle, the hybrid vehicle comprising:
  a sensing unit that measures a pack current, a pack voltage, and an internal resistance of the battery;
  a main control unit (MCU) that uses the pack current, the pack voltage, and the internal resistance transmitted from the sensing unit to determine the SOC, and that controls the battery to be charged and discharged; and
  a communication unit that transmits the SOC output from the MCU to the ECU, wherein the MCU comprises:
  an estimation SOC calculator that uses the pack current of the battery to calculate an estimation SOC;
  a reference SOC calculator that uses values of the pack current, the pack voltage and the internal resistance received from the sensor to calculate a reference open circuit voltage (OCV), and that calculates a reference SOC corresponding to the reference OCV; and
  an SOC compensator that detects an OCV corresponding to the estimation SOC, using a difference between the reference OCV and the detected OCV to determine whether to perform compensation, varying a compensation value according to a section in which the estimation SOC is included, to compensate the estimation SOC when the SOC compensator is required to perform the compensation, and outputting the estimation SOC when the SOC compensator is not required to perform the compensation.

26. The hybrid vehicle of claim 25, wherein:
  when a difference between the reference OCV and the detected OCV is greater than a first reference value, the SOC compensator detects a first section in which the estimation SOC is included among the at least two sections of the estimation SOC, and subtracts a first compensation value corresponding to the first section among the at least two first compensation values from the estimation SOC; and
  when the difference between the reference OCV and the detected OCV is less than a second reference value, the SOC compensator detects a second section in which the estimation SOC is included among the at least two sections, and adds a second compensation value corresponding to the second section among the plurality of second compensation values to the estimation SOC.

27. The hybrid vehicle of claim 25, wherein the battery management system further comprises a data base for storing data relating to the OCV corresponding to the estimation SOC.

* * * * *

UNITED STATES PATENT AND TRADEMARK OFFICE
CERTIFICATE OF CORRECTION

PATENT NO. : 7,679,329 B2
APPLICATION NO. : 11/639306
DATED : March 16, 2010
INVENTOR(S) : Gye-Jong Lim et al.

It is certified that error appears in the above-identified patent and that said Letters Patent is hereby corrected as shown below:

Column 10, line 62, "changes" should be --change--.

Signed and Sealed this

Seventeenth Day of August, 2010

David J. Kappos
*Director of the United States Patent and Trademark Office*